United States Patent
Hoirup et al.

(10) Patent No.: US 10,447,333 B2
(45) Date of Patent: *Oct. 15, 2019

(54) METHOD AND APPARATUS FOR RADIO ANTENNA FREQUENCY TUNING

(71) Applicant: BlackBerry Limited, Waterloo (CA)

(72) Inventors: Carsten Hoirup, Crystal Lake, IL (US); Keith Manssen, Bull Valley, IL (US); Matthew Russell Greene, Crystal Lake, IL (US)

(73) Assignee: BlackBerry Limited, Waterloo (CA)

( * ) Notice: Subject to any disclaimer, the term of this patent is extended or adjusted under 35 U.S.C. 154(b) by 0 days.

This patent is subject to a terminal disclaimer.

(21) Appl. No.: 15/916,340

(22) Filed: Mar. 9, 2018

(65) Prior Publication Data
US 2018/0198482 A1 Jul. 12, 2018

Related U.S. Application Data

(63) Continuation of application No. 15/606,953, filed on May 26, 2017, now Pat. No. 9,935,674, which is a
(Continued)

(51) Int. Cl.
*H04B 1/00* (2006.01)
*H04B 1/401* (2015.01)
(Continued)

(52) U.S. Cl.
CPC ............. *H04B 1/401* (2013.01); *H01Q 1/242* (2013.01); *H01Q 9/14* (2013.01); *H03H 7/40* (2013.01);
(Continued)

(58) Field of Classification Search
CPC . H01Q 1/242; H01Q 9/14; H04B 1/18; H04B 1/401; H04B 1/0458; H03H 7/40
(Continued)

(56) References Cited

U.S. PATENT DOCUMENTS 8,299,867 B2 * 10/2012 McKinzie, III .......... H03H 7/40
333/17.3
8,712,340 B2 * 4/2014 Hoirup .................. H01Q 1/242
455/77
(Continued)

FOREIGN PATENT DOCUMENTS

| WO | 2009155966 A1 | 12/2009 |
| WO | 2012067622 A1 | 5/2012 |
| WO | 2012112831 A1 | 8/2012 |

OTHER PUBLICATIONS

Communication pursuant to Article 94(3) EPC, EPO application No. 16151299.1, dated Jun. 22, 2018, 4 pages.
(Continued)

*Primary Examiner* — Ping Y Hsieh
(74) *Attorney, Agent, or Firm* — Guntin & Gust, PLC; Ralph Trementozzi

(57) ABSTRACT

A matching network of a communication device that incorporates teachings of the present disclosure may include, for example, a controller that executes instructions facilitating an identifying a subset of usage scenarios based on a usage condition of the communication device and adjusting the matching network device based on a subset of different tuning scenarios corresponding to the subset of usage scenarios. A group of operational parameters is obtained via parametric measurements for each tuning scenario change between the tuning scenarios corresponding to each of the subset of usage scenarios. Multiple operational parameters are averaged corresponding to each of the tuning scenarios to identify an average operational parameter for each tuning scenario, and a tuning scenario is selected from among the subset of different tuning scenarios based on a determination as to which of the average operational parameters correlates with a desired performance goal. Additional embodiments are disclosed.

20 Claims, 7 Drawing Sheets

Related U.S. Application Data continuation of application No. 14/951,946, filed on Nov. 25, 2015, now Pat. No. 9,698,858, which is a continuation of application No. 14/200,222, filed on Mar. 7, 2014, now Pat. No. 9,231,643, which is a continuation of application No. 13/030,177, filed on Feb. 18, 2011, now Pat. No. 8,712,340.

(51) Int. Cl.
| | | |
|---|---|---|
| *H01Q 1/24* | (2006.01) | |
| *H01Q 9/14* | (2006.01) | |
| *H03H 7/40* | (2006.01) | |
| *H04B 1/04* | (2006.01) | |
| *H04B 1/18* | (2006.01) | |
| *H04B 17/26* | (2015.01) | |
| *H04B 17/318* | (2015.01) | |

(52) U.S. Cl.
CPC .............. *H04B 1/0458* (2013.01); *H04B 1/18* (2013.01); *H04B 17/26* (2015.01); *H04B 17/318* (2015.01)

(58) Field of Classification Search
USPC ........ 455/67.11, 77, 78, 82, 83, 84, 87, 125, 455/234.1, 333, 120, 121, 193.1, 193.2, 455/230, 240.1, 69
See application file for complete search history.

(56) References Cited

U.S. PATENT DOCUMENTS

| | | | | |
|---|---|---|---|---|
| 9,231,643 | B2* | 1/2016 | Hoirup | H01Q 1/242 |
| 9,698,858 | B2* | 7/2017 | Hoirup | H01Q 1/242 |
| 9,935,674 | B2* | 4/2018 | Hoirup | H01Q 1/242 |
| 2003/0193997 | A1 | 10/2003 | Dent et al. | |
| 2005/0083234 | A1 | 4/2005 | Poilasne et al. | |
| 2005/0085204 | A1 | 4/2005 | Poilasne et al. | |
| 2006/0084392 | A1 | 4/2006 | Marholev et al. | |
| 2006/0099915 | A1* | 5/2006 | Laroia | H01Q 3/24 455/101 |
| 2006/0148415 | A1* | 7/2006 | Hamalainen | H04B 7/0634 455/69 |
| 2006/0160501 | A1 | 7/2006 | Mendolia et al. | |
| 2006/0223451 | A1 | 10/2006 | Posamentier | |
| 2007/0042725 | A1 | 2/2007 | Poilasne et al. | |
| 2009/0016124 | A1 | 1/2009 | Kim | |
| 2009/0051604 | A1 | 2/2009 | Zhang et al. | |
| 2009/0079656 | A1 | 3/2009 | Peyla et al. | |
| 2010/0069011 | A1 | 3/2010 | Carrick et al. | |
| 2010/0201598 | A1 | 8/2010 | Lau et al. | |
| 2010/0232474 | A1* | 9/2010 | Rofougaran | H01Q 21/061 375/135 |
| 2011/0105023 | A1* | 5/2011 | Scheer | H01Q 1/242 455/41.2 |
| 2017/0197180 | A1 | 7/2017 | Wei | |
| 2018/0083657 | A1 | 3/2018 | Manssen et al. | |
| 2018/0109235 | A1 | 4/2018 | McKinzie et al. | |

OTHER PUBLICATIONS

India, Patent O., "Examination Report", for Application No. 9844/DELNP/2013, dated Apr. 25, 2018, 5 pages.

Intellectual Property India, "First Examination Report", for Application No. 3160/CHE/2013 dated Jun. 5, 2018, Jun. 5, 2018, 5 pages.

Office Action dated Nov. 7, 2018, Canadian Patent Application 2,826,573, 4 pages.

Nowrouzian, B., "A necessary and sufficient condition for the BIBO stability of general-order bode-type variable-amplitude wave-digital equalizers," ICME '03. Proc., USA, 2003, pp. 373-376. (Year: 2003).

3317/DELNP/2012, first examination report, dated Mar. 22, 2019, 6 pages.

European Patent Office, "EP Office Action dated Feb. 28, 2019", for EP Application 11772625.7, Feb. 28, 2019, 11 pages.

* cited by examiner

700

LOOK-UP TABLE

| |
|---|
| Band 1; Use Case 1; Desired tuning state |
| Band 1; Use Case 2; Desired tuning state |
| ⋮ |
| Band 1; Use Case n; Desired tuning state |
| Band 2; Use Case 1; Desired tuning state |
| Band 2; Use Case 2; Desired tuning state |
| ⋮ |
| Band 2; Use Case n; Desired tuning state |
| Band N; Use Case 1; Desired tuning state |
| Band N; Use Case 2; Desired tuning state |
| ⋮ |
| Band N; Use Case n; Desired tuning state |

FIG. 9

METHOD AND APPARATUS FOR RADIO ANTENNA FREQUENCY TUNING

CROSS-REFERENCE TO RELATED APPLICATIONS

This application is a continuation of U.S. patent application Ser. No. 15/606,953, filed May 26, 2017, which is a continuation of U.S. patent application Ser. No. 14/951,946, filed Nov. 25, 2015 (now U.S. Pat. No. 9,698,858), which is a continuation of U.S. patent application Ser. No. 14/200,222, filed Mar. 7, 2014 (now U.S. Pat. No. 9,231,643), which is a continuation of U.S. patent application Ser. No. 13/030,177, filed Feb. 18, 2011 (now U.S. Pat. No. 8,712,340). The contents of each of the foregoing are hereby incorporated by reference into this application as if set forth herein in full.

FIELD OF THE DISCLOSURE

The present disclosure relates to a method and apparatus for radio antenna frequency tuning and in particular determining tuning states in a communication device.

BACKGROUND

Existing multi-frequency wireless devices (e.g., radios) use an antenna structure that attempts to radiate at optimum efficiency over the entire frequency range of operation, but can really only do so over a subset of the frequencies. Due to size constraints, and aesthetic design reasons, the antenna designer is forced to compromise the performance in some of the frequency bands. An example of such a wireless device could be a mobile telephone that operates over a range of different frequencies, such as 800 MHz to 2200 MHz. The antenna will not radiate efficiently at all frequencies due to the nature of the design, and the power transfer between the antenna, the power amplifier, and the receiver in the radio will vary significantly.

Additionally, an antenna's performance is impacted by its operating environment. For example, multiple use cases exist for radio handsets, which include such conditions as the placement of the handset's antenna next to a user's head, or in the user's pocket or the covering of an antenna with a hand, all of which can significantly impair the wireless device antenna's radiated efficiency.

Further, many existing radios use a simple circuit composed of fixed value components that are aimed at improving the power transfer from power amplifier to antenna, or from the antenna to the receiver, but since the components used are fixed in value there is always a compromise when attempting to cover multiple frequency bands and multiple use cases.

BRIEF DESCRIPTION OF THE DRAWINGS

FIG. 9 depicts an illustrative embodiment of a look-up table utilized by the communication device of FIG. 1.

DETAILED DESCRIPTION

Figure 1:
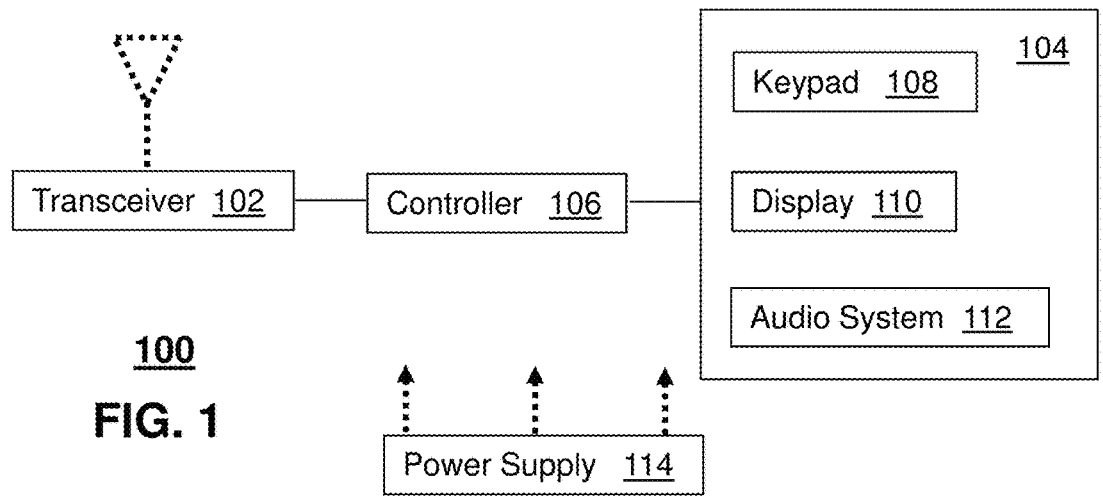
FIG. 1 depicts an illustrative embodiment of a communication device.

The present disclosure provides a method and apparatus for radio antenna frequency tuning. One or more exemplary embodiments can employ an open loop mechanism to solve the fundamental problems associated with antenna performance over a range of frequencies and use cases.

One or more exemplary embodiments can address applying tuning to changing antenna environments without the need for, or use of, a direct feedback loop from the antenna. However, other embodiments can utilized a combination of open loop and closed loop feedback.

One embodiment of the present disclosure entails a method to select a tuning state of a tunable matching network operable in a communication device, where the tunable matching network has a tunable reactance that affects one or more performance parameters of the communication device. The method can include performing the selection of the tuning state based on radio frequency and incomplete information about the antenna environment without direct feedback on the performance from the antenna, and identifying the tuning state resulting in the most desirable performance of the communications device.

In one embodiment, a method is provided that includes obtaining a usage condition associated with operation of a wireless communication device where the usage condition is obtained by a processor of the wireless communication device, selecting a subset of use cases from a group of use cases based on the usage condition, obtaining an operational parameter associated with a transceiver of the wireless communication device where the operational parameter is measured during the operation of the wireless communication device, and selecting a target use case from among the subset of use cases based on the operational parameter.

In another embodiment, a non-transitory computer-readable storage medium is provided that includes computer instructions to determine a subset of use cases from a group of use cases stored in a memory of a communication device and to determine a target use case from among the subset of use cases based on an operational parameter associated with a transceiver of the communication device.

In another embodiment, a matching network for a communication device can include an impedance matching circuit connectable with an antenna of the communication device, where the impedance matching circuit comprises one or more variable components. The matching network can also include a controller connectable with the impedance matching circuit. The controller can be configured to select a subset of use cases from a group of use cases based on a usage condition of the communication device, obtain an operational parameter associated with a transceiver of the communication device where the operational parameter is obtained during the operation of the communication device, select a target use case from among the subset of use cases based on the operational parameter, and adjust the one or more variable components based on the determined target use case to tune the impedance matching circuit.

In one embodiment, a look-up table can be utilized that maps possible use case positions to tuning states for the tunable matching network. Each of the possible use cases can be accommodated by a tuning state which attempts to provide a match for whatever performance attributes were selected by the product designer. In some instances, a particular use case can be completely identified by a set of detectable or otherwise known conditions that can be used to point to the correct or desired tuning state in the look up table. In other instances, the conditions (e.g., slider position, speaker activity, and so forth) can only narrow the possible number of use cases down to a subset of possible use cases in the look-up table. In these instances, the method of the present disclosure can be used to identify which of the tuning states can tune the adjustable matching network to achieve the desired performance of the communication device.

In one embodiment, after the appropriate tuning state is identified, the adjustable matching network is tuned to that state until the processor detects changes in the conditions or inputs that may indicate that the use case or the network channel number (e.g., operating frequency) has changed. Those inputs which can indicate a possible change in use case include, but are not limited to, received signal strength indicator (RSSI) or other operational parameters failing to satisfy a threshold. In one embodiment, the inputs can include the handset transmit power being increased by a certain number of power steps or dBs. Both of these inputs or conditions can indicate a possible change in the use case, but other inputs within the handset can also be utilized by the exemplary embodiments to indicate a possible change.

In another embodiment, a receiver parametric measurement, such as the RSSI, can be used as an indicator of which tuning state creates a better matching condition for the current usage case. It should be understood by one of ordinary skill in the art that other measurements, including other receiver based measurements, can be used to make this determination, such as bit error rate. It should be further understood that a plurality of measurements can be utilized in selecting a use case from among the possible subset of use cases.

FIG. 1 depicts an exemplary embodiment of a communication device 100. The communication device 100 can comprise a wireless transceiver 102, a user interface (UI) 104, a power supply 114, and a controller 106 for managing operations thereof. In one embodiment, the transceiver 102 can have independent transmitter and receiver portions. The wireless transceiver 102 can utilize short-range and/or long-range wireless access technologies such as Bluetooth, WiFi, Digital Enhanced Cordless Telecommunications (DECT), or cellular communication technologies, just to mention a few. Cellular technologies can include, for example, CDMA-1X, WCDMA, UMTS/HSDPA, GSM/GPRS, TDMA/EDGE, EV/DO, WiMAX, and next generation cellular wireless communication technologies as they arise.

The UI 104 can include a depressible or touch-sensitive keypad 108 with a navigation mechanism such as a roller ball, joystick, mouse, or navigation disk for manipulating operations of the communication device 100. The keypad 108 can be an integral part of a housing assembly of the communication device 100 or an independent device operably coupled thereto by a tethered wireline interface (such as a flex cable) or a wireless interface supporting for example Bluetooth. The keypad 108 can represent a numeric dialing keypad commonly used by phones, and/or a Qwerty keypad with alphanumeric keys. The UI 104 can further include a display 110 such as monochrome or color LCD (Liquid Crystal Display), OLED (Organic Light Emitting Diode) or other suitable display technology for conveying images to an end user of the communication device 100. In an embodiment where the display 110 is a touch-sensitive display, a portion or all of the keypad 108 can be presented by way of the display.

The power supply 114 can utilize common power management technologies (such as replaceable batteries, supply regulation technologies, and charging system technologies) for supplying energy to the components of the communication device 100 to facilitate portable applications. The controller 106 can utilize computing technologies such as a microprocessor and/or digital signal processor (DSP) with associated storage memory such a Flash, ROM, RAM, SRAM, DRAM or other like technologies.

Figure 2:
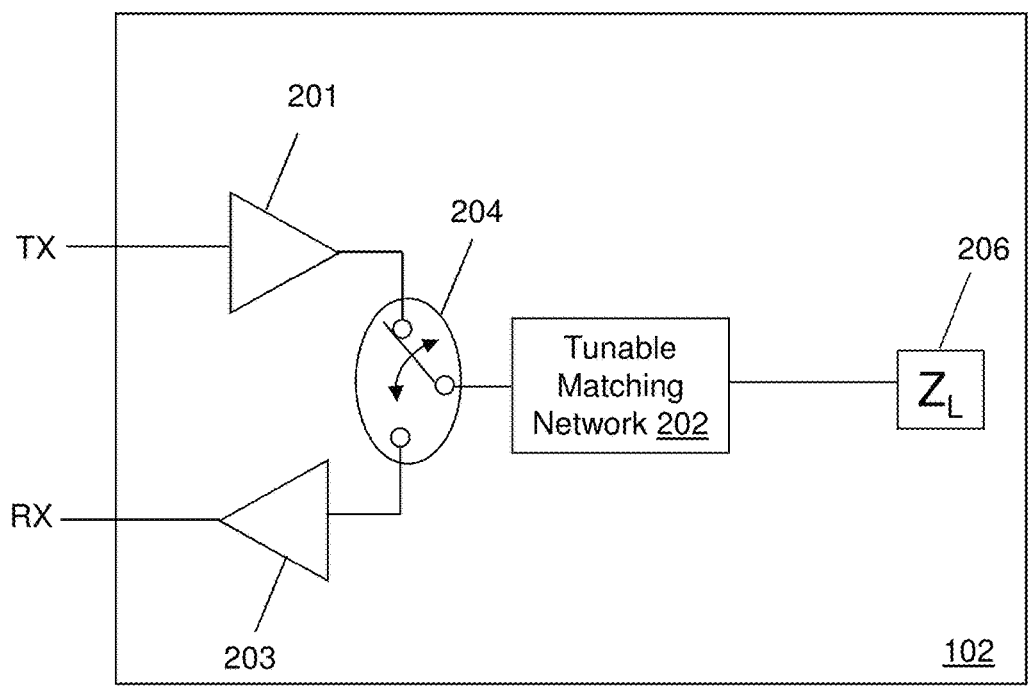
FIG. 2 depicts an illustrative embodiment of a portion of a transceiver of the communication device of FIG. 1.

In a possible circuit configuration 200, FIG. 2 depicts an illustrative embodiment of a portion of the wireless transceiver 102 of the communication device 100 of FIG. 1. In one embodiment, such as for GSM applications, the transmit and receive portions of the transceiver 102 can include amplifiers 201, 203 coupled to a tunable matching network 202 and an impedance load 206 by way of a switch 204. The load 206 in the present illustration can include an antenna as shown in FIG. 1 (herein antenna 206). A transmit signal in the form of a radio frequency (RF) signal (TX) can be directed to the amplifier 201 which amplifies the signal and directs the amplified signal to the antenna 206 by way of the tunable matching network 202 when switch 204 is enabled for a transmission session. The receive portion of the transceiver 102 can utilize a pre-amplifier 203 which amplifies signals received from the antenna 206 by way of the tunable matching network 202 when switch 204 is enabled for a receive session. Other configurations of FIG. 2 are possible for other types of cellular access technologies, such as CDMA. These undisclosed configurations are contemplated by the present disclosure.

Figure 3:
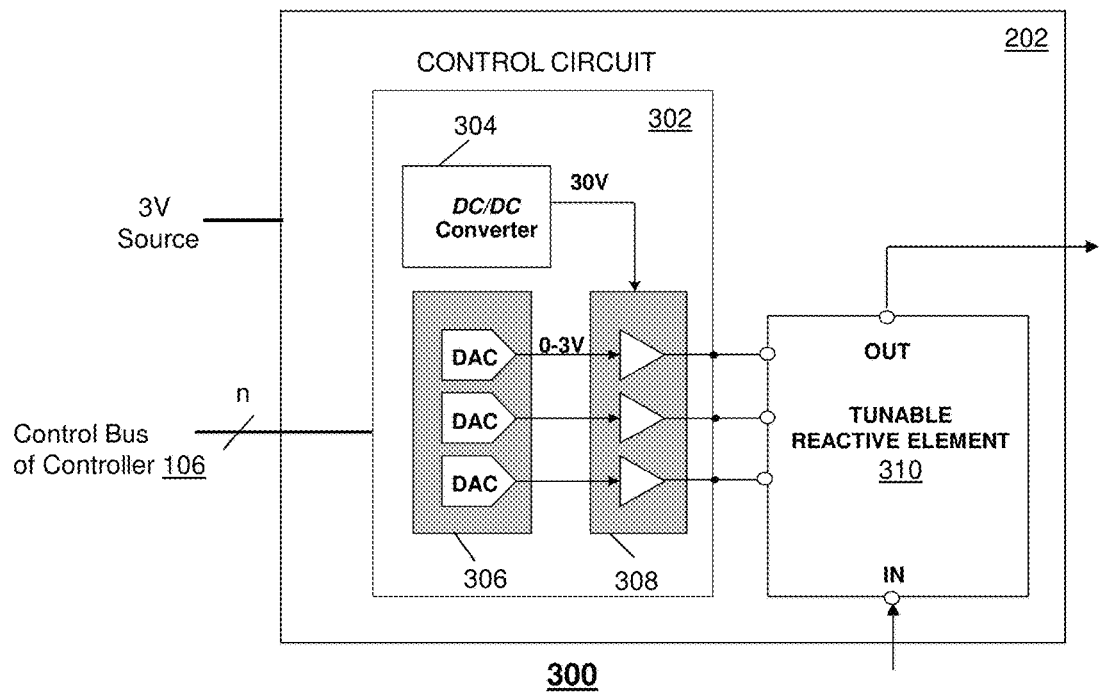
FIGS. 3-4 depict illustrative embodiments of a tunable matching network of the transceiver of FIG. 2.
Figure 4:
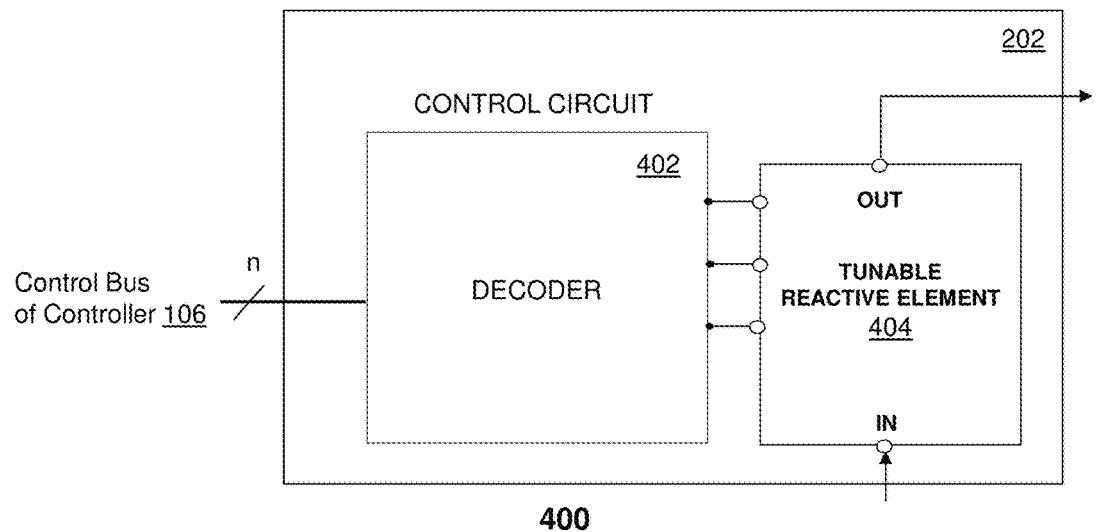
Figure 5:
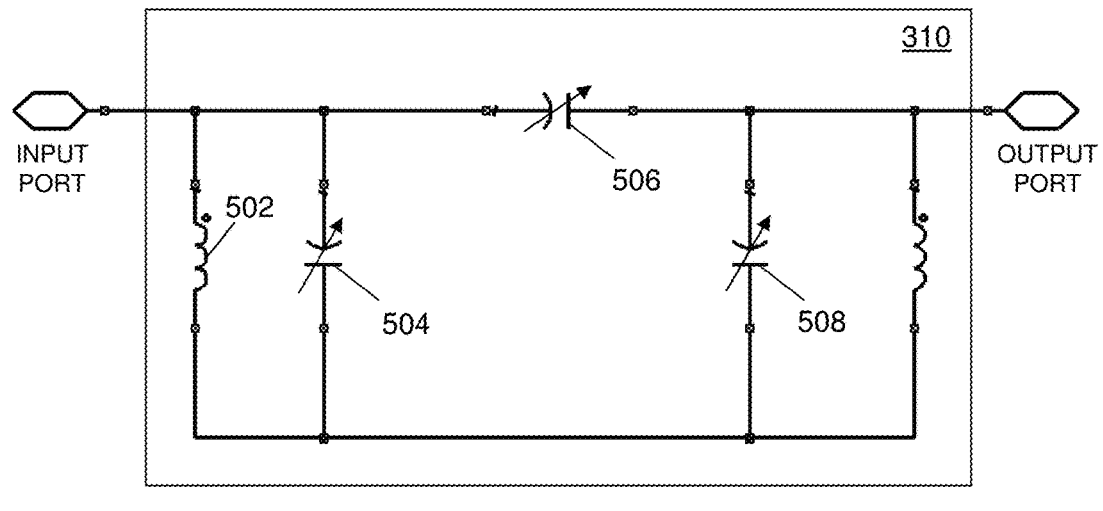
FIGS. 5-6 depict illustrative embodiments of a tunable reactive element of the tunable matching network.

FIGS. 3-4 depict illustrative embodiments of the tunable matching network 202 of the transceiver 102 of FIG. 2. In one embodiment, the tunable matching network 202 can comprise a control circuit 302 and a tunable reactive element 310. The control circuit 302 can comprise a DC-to-DC converter 304, one or more digital to analog converters (DACs) 306 and one or more corresponding buffers 308 to amplify the voltage generated by each DAC. The amplified signal can be fed to one or more tunable reactive components 504, 506 and 508 such as shown in FIG. 5, which depicts a possible circuit configuration 500 for the tunable reactive element 310. In this illustration, the tunable reactive element 310 includes three tunable capacitors 504, 506, 508 and an inductor 502 with a fixed inductance. Other circuit configurations are possible, including use of other components, and are thereby contemplated by the present disclosure.

The tunable capacitors 504, 506, 508 can each utilize technology that enables tunability of the capacitance of said component. One embodiment of the tunable capacitors 504, 506, 508 can utilize voltage or current tunable dielectric materials such as a composition of barium strontium titanate (BST). An illustration of a BST composition is the Parascan® Tunable Capacitor. In another embodiment, the tunable reactive element 310 can utilize semiconductor varactors. Other present or next generation methods or material compositions that can support a means for a voltage or current tunable reactive element are contemplated by the present disclosure.

The DC-to-DC converter 304 can receive a power signal such as 3 Volts from the power supply 114 of the communication device 100 in FIG. 1. The DC-to-DC converter 304 can use common technology to amplify this power signal to a higher range (e.g., 30 Volts) such as shown. The controller 106 can supply digital signals to each of the DACs 306 by way of a control bus of "n" or more wires to individually control the capacitance of tunable capacitors 504, 506, 508, thereby varying the collective reactance of the tunable matching network 202. The control bus can be implemented with a two-wire common serial communications technology such as a Serial Peripheral Interface (SPI) bus. With an SPI bus, the controller 106 can submit serialized digital signals to configure each DAC in a possible circuit configuration 300 of FIG. 3 or the switches of the tunable reactive element 404 in a possible circuit configuration 400 of FIG. 4. The control circuit 302 of FIG. 3 can utilize common digital logic to implement the SPI bus and to direct digital signals supplied by the controller 106 to the DACs.

Figure 6:
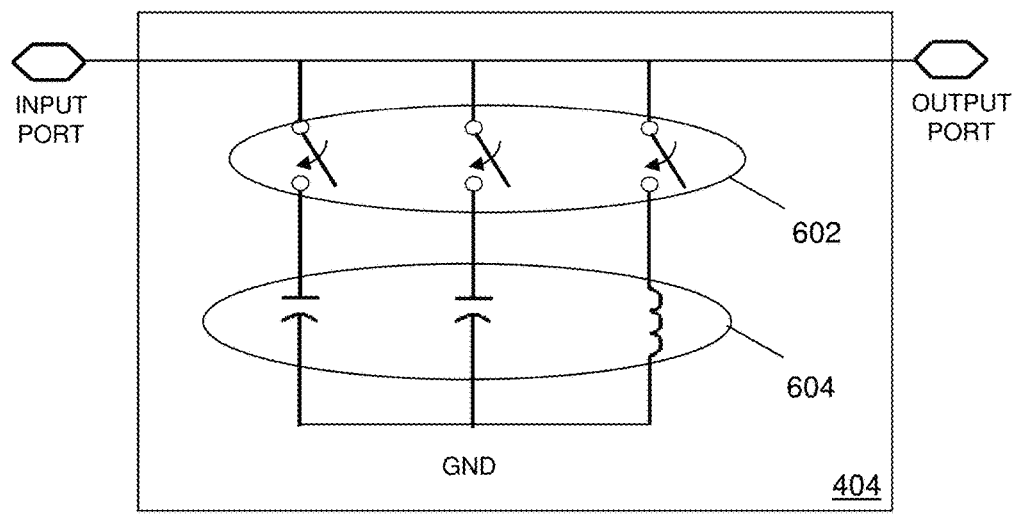

In another embodiment, the tunable matching network 202 can comprise a control circuit 402 in the form of a decoder and a tunable reactive element 404 comprising switchable reactive elements such as shown in the possible circuit configurations 400, 600 of FIGS. 4 and 6. In this embodiment, the controller 106 can supply the control circuit 402 signals via the SPI bus which can be decoded with Boolean or state machine logic to individually enable or disable the switching elements 602. The switching elements 602 can be implemented using various types of switches, such as semiconductor switches or micro-machined switches including those utilized in micro-electro-mechanical systems (MEMS). By independently enabling and disabling the reactive elements 604 (capacitor or inductor) of FIG. 6 with the switching elements 602, the collective reactance of the tunable reactive element 404 can be varied.

The tunability of the tunable matching networks 202, 204 provides the controller 106 a means to optimize performance parameters of the transceiver 102 such as, for example, but not limited to, transmitter power, transmitter efficiency, receiver sensitivity, power consumption of the communication device, a specific absorption rate (SAR) of energy by a human body, frequency band performance parameters, and so forth. To achieve one or more desirable performance characteristics which can be defined, the communication device 100 can utilize a tuning state selection method, such as depicted in FIG. 8.

Figure 7:
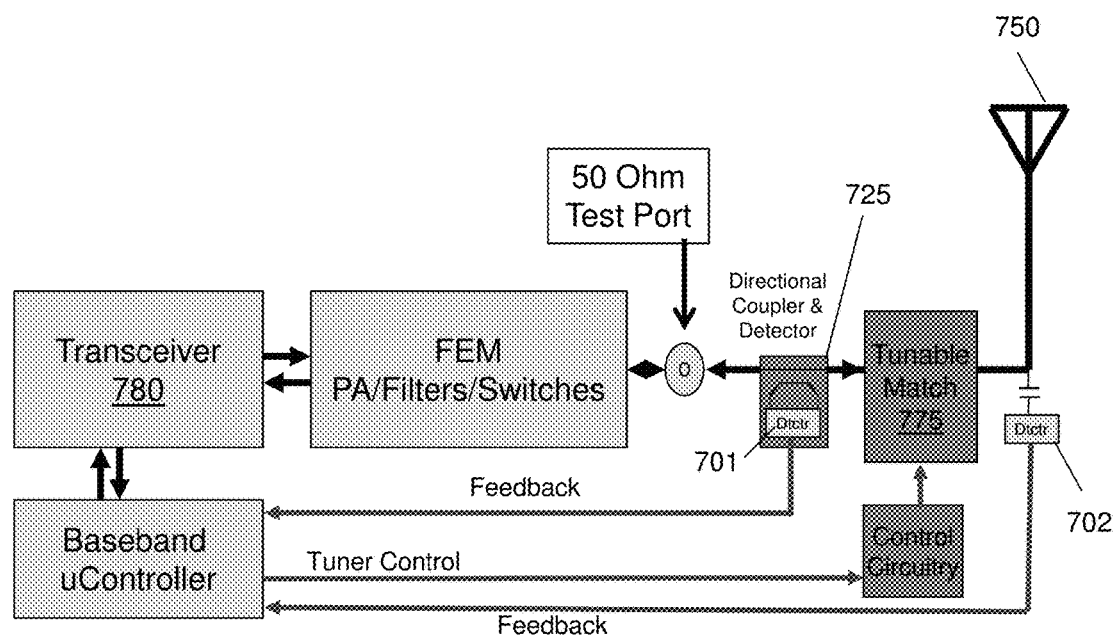
FIG. 7 depicts an illustrative embodiment of a portion of another communication device.

FIG. 7 depicts an exemplary embodiment of a portion of a communication device 700 (such as device 100 in FIG. 1) having a tunable matching network which can include, or otherwise be coupled with, a number of components such as a directional coupler, a sensor IC, control circuitry and/or a tuner. The tunable matching network can include various other components in addition to, or in place of, the components shown, including components described above with respect to FIGS. 1-6. In addition to the detector 701 coupled to the directional coupler 725, there is shown a detector 702 coupled to the RF line feeding the antenna 750. A tunable matching network 775 can be coupled to the antenna 750 and a transceiver 780 (or transmitter and/or receiver) for facilitating communication of signals between the communication device 700 and another device or system. In this exemplary embodiment, the tunable match can be adjusted using all or a portion of the detectors for feedback to the tuning algorithm.

Figure 8:
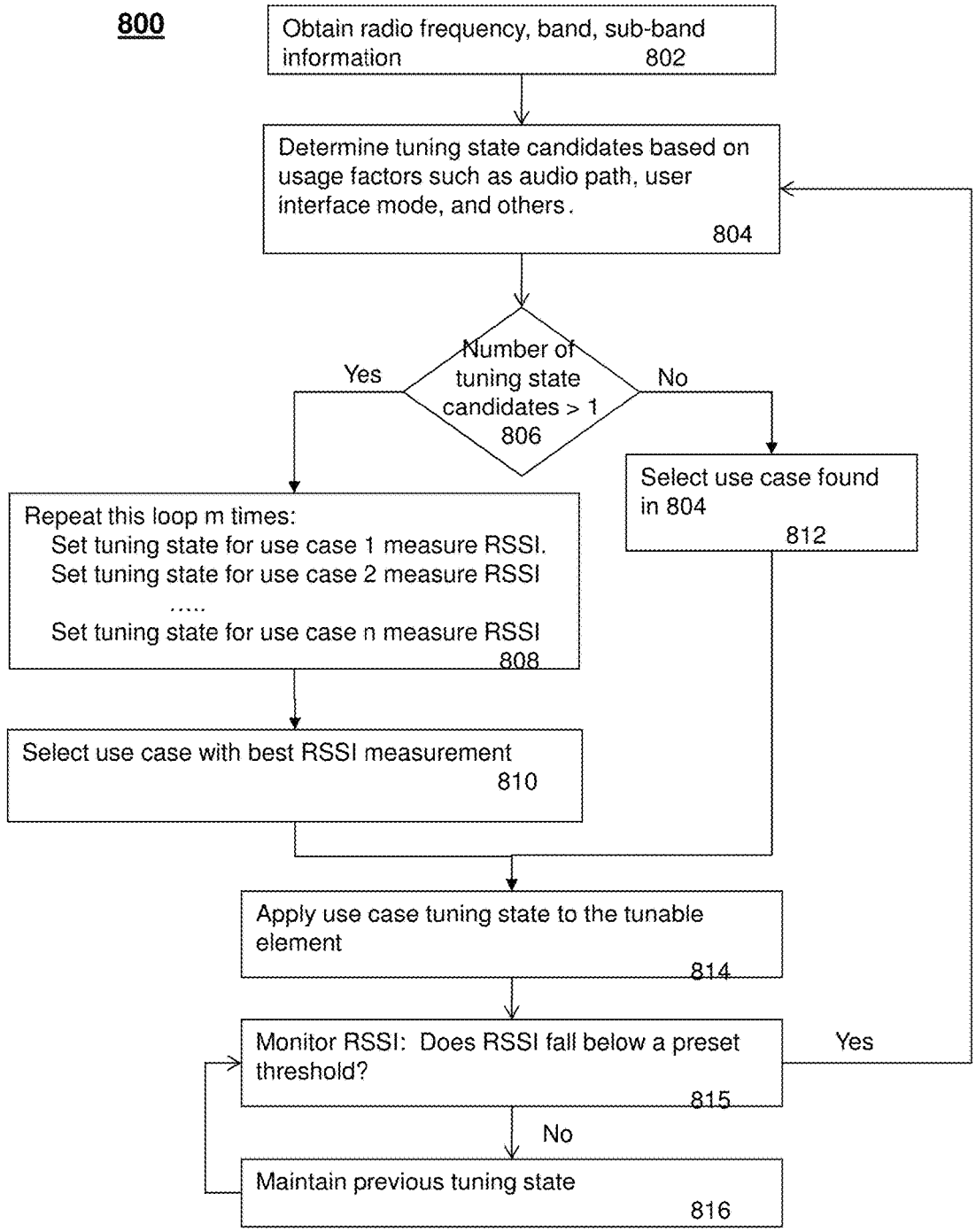
FIG. 8 depicts an exemplary method operating in the communication device in FIG. 1.

In addition to the algorithm described with respect to FIG. 8, other algorithms can be utilized for tuning of the antenna 750, such as disclosed in U.S. patent application Ser. No. 12/941,972 filed on Nov. 8, 2010 by Manssen et al., the disclosure of which is hereby incorporated by reference herein. Other algorithms that can be used with the exemplary embodiments described herein are disclosed in U.S. Patent Application Publication 2009/0121963 filed on Nov. 14, 2007 by Greene, the disclosure of which is hereby incorporated by reference herein. The Greene Application describes several methods utilizing Figures of Merit, which in this exemplary embodiment can be determined in whole or in part from measurements of the forward and reverse signals present at detector 701. This exemplary embodiment, can also utilize detector 702 to further improve the ability of the tuning system to enable improved performance of the communication device. One embodiment of the algorithm can utilize the inputs from detector 701 to establish a maximum return loss or VSWR for the matching network. This method can establish a range of impedances around the targeted impedance. This range of impedances may establish an acceptable level of performance. Input from detector 702 can then be utilized to allow the algorithm to find an improved or best impedance within that acceptable range. For instance, the algorithm could continue to modify the matching network 775 in order to increase the RF voltage detected at the antenna feed, while constraining the return loss (measured by detector 701) to stay within the target return loss. In this embodiment, communication device 700 can allow tuning for source impedances that are not 50 ohms. In this example, the lowest insertion loss can be chosen for the tuning algorithm.

In another embodiment, the tuning algorithm can maintain the return loss while minimizing the current drain to determine desired tuning values. The tuning algorithm can utilize various parameters for tuning the device, including output power of the transmitter, return loss, received power, current drain and/or transmitter linearity.

FIG. 8 depicts an embodiment of yet another algorithmic method 800 which can be used for selecting a desired tuning state, while also resolving any inaccuracy in determining a particular use case that affects the antenna environment and resulting antenna performance. In 802, the radio frequency and/or other RF information (e.g., band and sub-band) can be determined. One or more usage conditions or factors such as, for example, but not limited to, audio path configuration, user interface mode of operation, and radio bearer type, can be used at 804 to determine a number of tuning state candidates, which have the highest probability of matching the actual environment of the communication device.

In one embodiment, the tuning state candidates can be obtained from one or more look-up tables 900, such as shown in FIG. 9. In another embodiment, the look-up table 900 can be indexed (e.g., by the controller 106 of the communication device 100 of FIG. 1) during operation according to band and/or use case. The look-up table 900 can be static and/or dynamic. For example, the look-up table 900 can be pre-loaded into the memory of the communication device 100 based on known or estimated use cases, usage conditions or factors, and so forth. In another example, the look-up table 900 can be populated or adjusted based on values determined during operation of the communication device 100. The tuning state candidates can be a subset of use cases that are selected from a group of use cases stored in a memory of the communication device, such as in table 900.

Method 800 can employ a threshold to remove the most unlikely tuning state candidates from consideration. When more than one tuning state candidate has been found at 806, method 800 can resolve which candidate provides the desirable or best match at 808 by examining parameters such as those that are readily available in the wireless device. As an example, but not being limited thereto, method 800 can utilize RSSI, Received Signal Code Power (RSCP), Received Signal Quality (RXQUAL), Received Bit Error Rate, current drain, transmit power control level, and so forth as parameters to select a tuning state from among the subset of tuning states that were identified at 804. One of these or other parameters can be utilized alone in selecting from among the subset of identified tuning states or a combination of parameters can be utilized by method 800 for performing the tuning state selection. In addition, feedback from the cellular base station can be utilized. For instance, if the handset is directed to transmit at a lower power step with one tuning state than another, that information could be utilized to determine which tuning state provides a better match for the handset transmitter. Other parameters can also be utilized for performing the tuning state selection from among the subset of tuning states, including parameters identified in various communication device standards. In another embodiment, the directional coupler of FIG. 7 can be utilized for obtaining the operational parameter that is used with method 800.

Method 800 can set the tuning state and sample the parameter(s) resulting from that tuning state change. In one embodiment, at least one sample for each tuning state setting can be utilized. More samples may also be utilized in which case the sample order can be interleaved as shown in step 808 where the n different possible tuning states can be set and RSSI or other parameter(s) measured for each, with each of the n states repeated m times. The resultant m measurements for each state can be then be averaged or otherwise processed in order to determine which tuning state will be chosen as the preferred state. When samples have been collected they are evaluated at 810 and the use case from among the identified subset of use cases that best matches the desired performance goal is selected, such as, for example, but not limited to, the best RSSI measurement. As described above, use of RSSI is an example and one or more other parameters can be used in place of, or in combination with, the RSSI parameter.

If the number of tuning state candidates or use cases selected at 804 is only one then at 812 the method 800 can select and use that one use case. The method 800 then applies the selected tuning state to the tunable element 814.

Method 800 can enter a loop at 815 which monitors RSSI or the one or more other parameters utilized, and compares measurements (or averaged measurements) to a preset threshold associated with the parameter(s). If the monitored level drops below, or otherwise no longer satisfies the threshold, then the method 800 can return to 804 to determine the tuning state candidate(s). If the threshold is satisfied, then the method 800 can maintain the previous tuning state at 816 and returns to 815. In another embodiment, method 800 can monitor other parameters at 815 which are different from the parameter(s) used at 808, 810 to select the best or desirable use case among the subset of identified use cases. For example, the parameter(s) used to select among the identified use cases can be different from the parameter(s) used to determine whether method 800 needs to again determine tuning state candidates back at 804.

Figure 10:
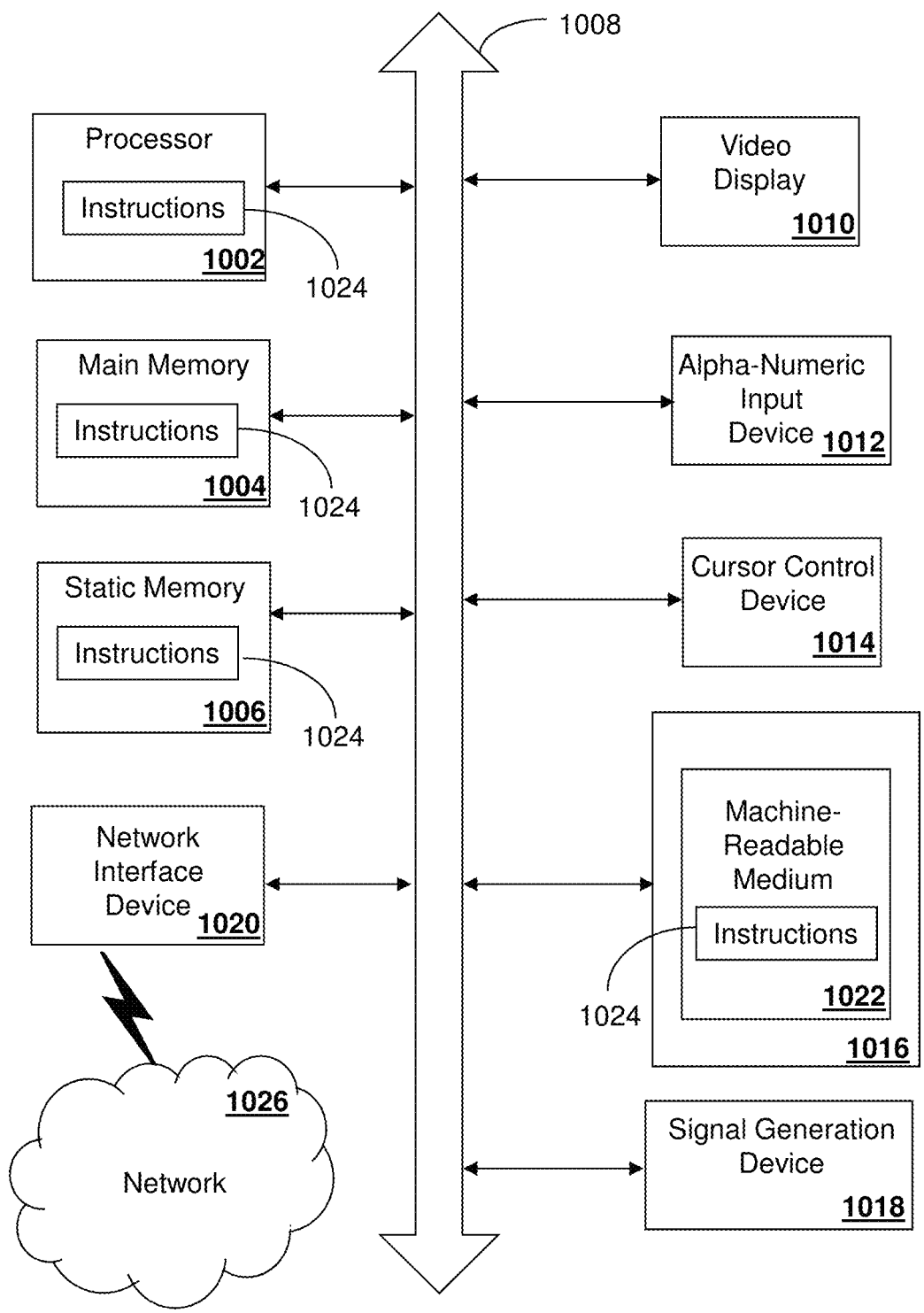
FIG. 10 depicts an exemplary diagrammatic representation of a machine in the form of a computer system within which a set of instructions, when executed, may cause the machine to perform any one or more of the methodologies disclosed herein.

FIG. 10 depicts an exemplary diagrammatic representation of a machine in the form of a computer system 1000 within which a set of instructions, when executed, may cause the machine to perform any one or more of the methodologies discussed above. In some embodiments, the machine operates as a standalone device. In some embodiments, the machine may be connected (e.g., using a network) to other machines. In a networked deployment, the machine may operate in the capacity of a server or a client user machine in server-client user network environment, or as a peer machine in a peer-to-peer (or distributed) network environment.

The machine may comprise a server computer, a client user computer, a personal computer (PC), a tablet PC, a laptop computer, a desktop computer, a control system, a network router, switch or bridge, or any machine capable of executing a set of instructions (sequential or otherwise) that specify actions to be taken by that machine. It will be understood that a device of the present disclosure includes broadly any electronic device that provides voice, video or data communication. Further, while a single machine is illustrated, the term "machine" shall also be taken to include any collection of machines that individually or jointly execute a set (or multiple sets) of instructions to perform any one or more of the methodologies discussed herein.

The computer system 1000 may include a processor 1002 (e.g., a central processing unit (CPU), a graphics processing unit (GPU, or both), a main memory 1004 and a static memory 1006, which communicate with each other via a bus 1008. The computer system 1000 may further include a video display unit 1010 (e.g., a liquid crystal display (LCD), a flat panel, a solid state display, or a cathode ray tube (CRT)). The computer system 1000 may include an input device 1012 (e.g., a keyboard), a cursor control device 1014 (e.g., a mouse), a disk drive unit 1016, a signal generation device 1018 (e.g., a speaker or remote control) and a network interface device 1020.

The disk drive unit 1016 may include a machine-readable medium 1022 on which is stored one or more sets of instructions (e.g., software 1024) embodying any one or more of the methodologies or functions described herein, including those methods illustrated above. The instructions 1024 may also reside, completely or at least partially, within the main memory 1004, the static memory 1006, and/or within the processor 1002 during execution thereof by the computer system 1000. The main memory 1004 and the processor 1002 also may constitute machine-readable media.

Dedicated hardware implementations including, but not limited to, application specific integrated circuits, programmable logic arrays and other hardware devices can likewise be constructed to implement the methods described herein. Applications that may include the apparatus and systems of various embodiments broadly include a variety of electronic and computer systems. Some embodiments implement functions in two or more specific interconnected hardware modules or devices with related control and data signals communicated between and through the modules, or as portions of an application-specific integrated circuit. Thus, the example system is applicable to software, firmware, and hardware implementations.

In accordance with various embodiments of the present disclosure, the methods described herein are intended for operation as software programs running on a computer processor. Furthermore, software implementations can include, but not limited to, distributed processing or component/object distributed processing, parallel processing, or virtual machine processing can also be constructed to implement the methods described herein.

The present disclosure contemplates a machine readable medium containing instructions 1024, or that which receives and executes instructions 1024 from a propagated signal so that a device connected to a network environment 1026 can send or receive voice, video or data, and to communicate over the network 1026 using the instructions 1024. The instructions 1024 may further be transmitted or received over a network 1026 via the network interface device 1020.

While the machine-readable medium 1022 is shown in an example embodiment to be a single medium, the term "machine-readable medium" should be taken to include a single medium or multiple media (e.g., a centralized or distributed database, and/or associated caches and servers) that store the one or more sets of instructions. The term "machine-readable medium" shall also be taken to include any medium that is capable of storing, encoding or carrying a set of instructions for execution by the machine and that cause the machine to perform any one or more of the methodologies of the present disclosure.

The term "machine-readable medium" shall accordingly be taken to include, but not be limited to: solid-state memories such as a memory card or other package that houses one or more read-only (non-volatile) memories, random access memories, or other re-writable (volatile) memories; magneto-optical or optical medium such as a disk or tape; and/or a digital file attachment to e-mail or other self-contained information archive or set of archives is considered a distribution medium equivalent to a tangible storage medium. Accordingly, the disclosure is considered to include any one or more of a machine-readable medium or a distribution medium, as listed herein and including art-recognized equivalents and successor media, in which the software implementations herein are stored.

Although the present specification describes components and functions implemented in the embodiments with reference to particular standards and protocols, the disclosure is not limited to such standards and protocols. Each of the standards for Internet and other packet switched network transmission (e.g., TCP/IP, UDP/IP, HTML, HTTP) represent examples of the state of the art. Such standards are periodically superseded by faster or more efficient equivalents having essentially the same functions. Accordingly, replacement standards and protocols having the same functions are considered equivalents.

The illustrations of embodiments described herein are intended to provide a general understanding of the structure of various embodiments, and they are not intended to serve as a complete description of all the elements and features of apparatus and systems that might make use of the structures described herein. Many other embodiments will be apparent to those of skill in the art upon reviewing the above description. Other embodiments may be utilized and derived therefrom, such that structural and logical substitutions and changes may be made without departing from the scope of this disclosure. Figures are also merely representational and may not be drawn to scale. Certain proportions thereof may be exaggerated, while others may be minimized. Accordingly, the specification and drawings are to be regarded in an illustrative rather than a restrictive sense.

Such embodiments of the inventive subject matter may be referred to herein, individually and/or collectively, by the term "invention" merely for convenience and without intending to voluntarily limit the scope of this application to any single invention or inventive concept if more than one is in fact disclosed. Thus, although specific embodiments have been illustrated and described herein, it should be appreciated that any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent to those of skill in the art upon reviewing the above description.

The Abstract of the Disclosure is provided with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

What is claimed is:

1. A matching network for a communication device, the matching network comprising:
    an impedance matching circuit connectable with an antenna of the communication device, the impedance matching circuit comprising one or more variable components;
    a control processing system including a processor connectable with the impedance matching circuit; and
    a memory that stores executable instructions that, when executed by the control processing system facilitates performance of operations, the operations comprising:
        identifying a subset of usage scenarios from a group of usage scenarios stored in a memory of the communication device, the subset of usage scenarios being identified based on a usage condition of the communication device;
        adjusting the matching network of the communication device based on a subset of different tuning scenarios corresponding to the subset of usage scenarios;
        obtaining a group of operational parameters via parametric measurements for each tuning scenario change between the different tuning scenarios corresponding to each of the subset of usage scenarios, wherein the group of operational parameters includes multiple operational parameters obtained at each of the different tuning scenarios at different times during an ordered sequence of sampling;
        averaging the multiple operational parameters corresponding to each of the different tuning scenarios to identify an average operational parameter for each tuning scenario, resulting in a plurality of average operational parameters; and
        reviewing the subset of different tuning scenarios and selecting one tuning scenario of the subset of different tuning scenarios to obtain a selected tuning scenario based on a determination as to which of the plurality of average operational parameters correlates with a desired performance goal.

2. The matching network of claim 1, wherein the group of operational parameters further comprises a received signal strength indicator associated with a downlink signal from a base station, and wherein the usage condition comprises a radio bearer type.

3. The matching network of claim 1, wherein the operations further comprise:
    receiving instructions from a base station, wherein the instructions are utilized in the identifying the subset of usage scenarios.

4. The matching network of claim 1, wherein the operational parameter is associated with a receive portion of a transceiver and is obtained during a receive mode of the communication device.

5. The matching network of claim 1, wherein the average operational parameter is based on a downlink signal from a base station and comprises at least one of a downlink signal strength indicator, a downlink signal code power, a downlink signal quality, current drain, or a downlink bit error rate.

6. The matching network of claim 1, wherein the operations further comprise:
monitoring for a change in the operational parameter; and
reviewing the group of usage scenarios to identify another subset of usage cases, when the change in the operation parameter no longer satisfies a threshold.

7. The matching network of claim 1, wherein the operations further comprise tuning impedance matching circuit based on the selected tuning scenario.

8. A method comprising:
identifying, by a processing system of a communication device including a processor, a subset of usage scenarios from a group of usage scenarios stored in a memory, the subset of usage scenarios being identified based on a usage condition of the communication device;
adjusting, by the processing system, a matching network of the communication device based on tuning scenarios corresponding to each of the subset of usage scenarios;
obtaining, by the processing system, a group of operational parameters via parametric measurements for each tuning scenario change between the tuning scenarios corresponding to each of the subset of usage scenarios, wherein the group of operational parameters include multiple operational parameters obtained at each of the tuning scenarios at different times during an ordered sequence of sampling;
averaging, by the processing system, the multiple operational parameters corresponding to each of the tuning scenarios to identify an average operational parameter for each tuning scenario, resulting in a plurality of average operational parameters; and
reviewing, by the processing system, the subset of usage scenarios to identify a target usage scenario based on a determination as to which of the plurality of average operational parameters correlates with a desired performance goal.

9. The method of claim 8, wherein the group of operational parameters further comprises a received signal strength indicator, and wherein the usage condition comprises a radio bearer type.

10. The method of claim 8, further comprising:
receiving, by the processing system, instructions from a base station to obtain received instructions, wherein the received instructions are utilized in the identifying the subset of usage scenarios.

11. The method of claim 8, wherein the operational parameter is associated with a receive portion of a transceiver and is obtained during a receive mode of the communication device.

12. The method of claim 8, wherein the operational parameter is based on a downlink signal and comprises at least one of a downlink signal strength indicator, a downlink signal code power, a downlink signal quality, current drain, or a downlink bit error rate.

13. The method of claim 8, further comprising:
monitoring, by the processing system, for a change in the operational parameter; and
reviewing, by the processing system, the group of usage scenarios to identify another subset of usage scenarios, when the change in the operation parameter no longer satisfies a threshold.

14. The method of claim 8, further comprising tuning, by the processing system, impedance matching circuit based on the target usage scenario.

15. A matching network for a communication device, the matching network comprising:
a tunable network having tuning elements;
a memory that stores executable instructions; and
a processing system including a processor, wherein the processing system, responsive to executing the instructions, facilitates performance of operations, the operations comprising:
identifying a subset of usage scenarios from a group of usage scenarios stored in a memory of the communication device, the subset of usage scenarios being identified based on a usage condition of the communication device;
adjusting the matching network of the communication device based on a subset of different tuning scenarios corresponding to the subset of usage scenarios;
obtaining a group of operational parameters via parametric measurements for each tuning scenario change between the different tuning scenarios corresponding to each of the subset of usage scenarios, wherein the group of operational parameters include multiple operational parameters obtained at each of the different tuning scenarios at different times during an ordered sequence of sampling;
averaging the multiple operational parameters corresponding to each of the different tuning scenarios to identify an average operational parameter for each tuning scenario, resulting in a plurality of average operational parameters; and
reviewing the subset of different tuning scenarios and selecting one tuning scenario of the subset of different tuning scenarios to identify a target tuning scenario based on a determination as to which of the plurality of average operational parameters correlates with a desired performance goal,
wherein the group of operational parameters comprises a received signal strength indicator, and
wherein the reviewing of the subset of different tuning scenarios to identify the target tuning scenario is further based on tuning information provided by a base station.

16. The matching network of claim 15, wherein the group of operational parameters further comprises a received signal strength indicator, and wherein the usage condition comprises a radio bearer type.

17. The matching network of claim 15, wherein the operations further comprise:
receiving instructions from a base station to obtain received instructions, wherein the received instructions are utilized in the identifying the subset of usage scenarios.

18. The matching network of claim 15, wherein the operational parameter is associated with a receive portion of a transceiver and is obtained during a receive mode of the communication device.

19. The matching network of claim 15, wherein the operational parameter comprises at least one of a received signal strength indicator, a downlink signal code power, a downlink signal quality, current drain, or a downlink bit error rate.

20. The matching network of claim 15, wherein the operations further comprise:
  monitoring for a change in the operational parameter; and
  reviewing the group of usage scenarios to identify another subset of usage scenarios, when the change in the operation parameter no longer satisfies a threshold.

\* \* \* \* \*